United States Patent
Nagai

(10) Patent No.: US 8,451,030 B2
(45) Date of Patent: May 28, 2013

(54) OUTPUT DEVICE AND TEST APPARATUS

(75) Inventor: Hiroyuki Nagai, Saitama (JP)

(73) Assignee: Advantest Corporation, Tokyo (JP)

( * ) Notice: Subject to any disclaimer, the term of this patent is extended or adjusted under 35 U.S.C. 154(b) by 400 days.

(21) Appl. No.: 12/796,584

(22) Filed: Jun. 8, 2010

(65) Prior Publication Data
US 2010/0327917 A1 Dec. 30, 2010

(30) Foreign Application Priority Data
Jun. 30, 2009 (JP) ................................. 2009-156183

(51) Int. Cl.
*H03B 1/00* (2006.01)
(52) U.S. Cl.
USPC .......................................................... 327/108
(58) Field of Classification Search
USPC .......................................................... 327/108
See application file for complete search history.

(56) References Cited

U.S. PATENT DOCUMENTS
2008/0317164 A1* 12/2008 Satou ............................ 375/295

FOREIGN PATENT DOCUMENTS
JP 2004-012225 A 1/2004
JP 2004-309153 A 11/2004

* cited by examiner

*Primary Examiner* — Daniel Rojas

(57) ABSTRACT

An output device includes a main driver that outputs an output signal in accordance with an input signal input thereto, a noise driver that outputs a noise signal containing a noise waveform, a combiner that outputs a combined signal obtained by combining together the output signal and the noise signal, and a controller. The noise driver (i) sets an output end thereof at high impedance when not supplied with an enable signal, and (ii) varies an voltage level of the noise signal to be output therefrom in accordance with how a control signal supplied thereto varies when supplied with the enable signal. The controller controls the noise driver to output the noise signal containing the noise waveform that occurs when the output signal travels through a predetermined transmission line, by controlling a timing at which the control signal varies and a timing at which the enable signal is switched.

20 Claims, 8 Drawing Sheets

OUTPUT DEVICE AND TEST APPARATUS

BACKGROUND

1. Technical Field

The present invention relates to an output device for outputting a signal and to a test apparatus for testing a device under test.

2. Related Art

A test apparatus is connected to a device under test by means of a substantially ideal transmission line having low L and C components. Thus, less noise is added to the signal output from the test apparatus while the signal travels through the transmission line. Here, a known test apparatus applies to a device under test a test signal that contains noise (see Patent Documents 1 and 2).

Patent Document 1: Japanese Patent Application Publication No. 2004-012225
Patent Document 2: Japanese Patent Application Publication No. 2004-309153

Here, when the device under test is actually utilized, a signal directed at the device under test travels through a transmission line formed in a printed circuit board, for example. Therefore, more noise is added to the signal during its travel through the transmission line than when the device under test is tested. For this reason, when actually used, the device under test may turn out to be defective even if the device under test has been judged to be acceptable by the test apparatus.

SUMMARY

To address the above-described issue, a first embodiment of the present invention provides an output device including a main driver that outputs an output signal in accordance with an input signal input thereto, a noise driver that outputs a noise signal containing a noise waveform, and a combiner that outputs a combined signal obtained by combining together the output signal and the noise signal. The first embodiment of the present invention also provides a test apparatus. The noise driver (i) may set an output end thereof at high impedance when not supplied with an enable signal, and (ii) vary an voltage level of the noise signal to be output therefrom in accordance with how a control signal supplied thereto varies when supplied with the enable signal. The output device may further include a controller that controls the noise driver to output the noise signal containing the noise waveform that occurs when the output signal travels through a predetermined transmission line, by controlling a timing at which the control signal varies and a timing at which the enable signal is switched.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
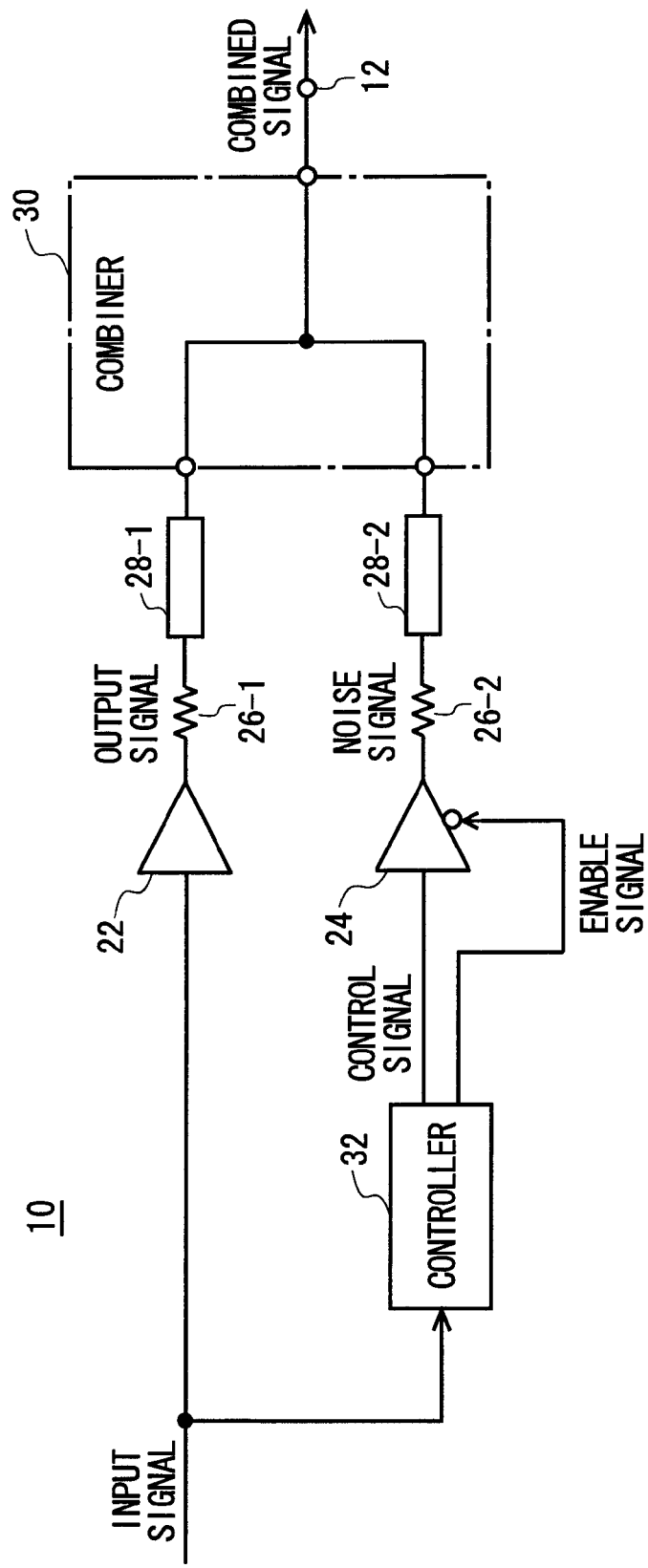
FIG. 1 illustrates the configuration of an output device 10 relating to an embodiment of the present invention.

FIG. 1 illustrates the configuration of an output device 10 relating to an embodiment of the present invention. The output device 10 relating to the present embodiment outputs a combined signal obtained by combining together an output signal that is generated in accordance with an input signal input to the output device 10 and a noise signal containing a noise waveform.

For example, the output device 10 is used as a signal source of a test apparatus. In this case, the output device 10 outputs, as a test signal, a combined signal that is obtained by combining together an output signal that is generated in accordance with a test pattern supplied to the output device 10 and a noise signal containing a noise waveform. The noise waveform may be determined in accordance with the noise that may occur when the output signal generated in accordance with the test pattern travels through a transmission line of the actual usage environment of a device under test. Such a test apparatus including the output device 10 will be described later with reference to FIG. 9.

The output device 10 includes a main driver 22, a noise driver 24, a first output resistance 26-1, a second output resistance 26-2, a first signal line 28-1, a second signal line 28-2, a combiner 30, and a controller 32.

The main driver 22 receives an input signal representing a logic value, and outputs an output signal in accordance with the received input signal. For example, the main driver 22 outputs an output signal whose voltage level is set to represent the L logic when the received input signal represents the L logic. As an alternative example, the main driver 22 outputs an output signal whose voltage level is set to represent the H logic when the received input signal represents the H logic.

The noise driver 24 is controlled by the controller 32 so as to output a noise signal containing a noise waveform. Specifically speaking, the noise driver 24 outputs a noise signal containing a noise waveform that is determined in accordance with a control signal and an enable signal received from the controller 32.

The noise driver 24 sets its output at high impedance, while the enable signal is not supplied to the noise driver 24. The noise driver 24 varies the voltage level of the noise signal output therefrom, in accordance with the varying control signal supplied thereto, while the enable signal is supplied to the noise driver 24.

Specifically speaking, the noise driver 24 varies the voltage level of the noise signal from the voltage level corresponding to the L logic to the voltage level corresponding to the H logic, when supplied with the enable signal and the control signal varies from the L logic to the H logic. The noise driver 24 varies the voltage level of the noise signal from the voltage level corresponding to the H logic to the voltage level corresponding to the L logic, when supplied with the enable signal and the control signal varies from the H logic to the L logic.

The first output resistance 26-1 is connected at one end thereof to the output end of the main driver 22. The first signal line 28-1 is connected at one end thereof to the end of the first output resistance 26-1 that is not connected to the main driver 22. The end of the first signal line 28-1 that is not connected to the first output resistance 26-1 is connected to the combiner 30. Thus, the first output resistance 26-1 and the first signal line 28-1 are connected in series to each other, and can pass the output signal output from the main driver 22 to the combiner 30.

The second output resistance 26-2 is connected at one end thereof to the output end of the noise driver 24. The second signal line 28-2 is connected at one end thereof to the end of the second output resistance 26-2 that is not connected to the noise driver 24. The end of the second signal line 28-2 that is not connected to the second output resistance 26-2 is connected to the combiner 30. Thus, the second output resistance 26-2 and the second signal line 28-2 are connected in series to each other, and can pass the noise signal output from the noise driver 24 to the combiner 30.

The combiner 30 receives the output signal output from the main driver 22 and the noise signal output from the noise driver 24, and combines together the output signal and the noise signal to generate a combined signal. For example, the combiner 30 outputs a combined signal obtained by adding together the output signal and the noise signal. The combiner 30 then outputs the combined signal obtained by combining together the output signal and the noise signal from an output terminal 12.

For example, the combiner 30 may be configured such that the signal line through which the output signal from the main driver 22 travels and the signal line through which the noise signal from the noise driver 24 travels are merged together into a single signal line. As an alternative example, the combiner 30 may be configured such that the signal line through which the output signal from the main driver 22 travels and the signal line through which the noise signal from the noise driver 24 travels are connected together via resistances. In this case, the values of the respective resistances are selected so that the value of the resistance of the combiner 30 when seen from the output terminal 12 is equal to the value of the terminating resistance (for example, 50Ω, 75Ω or the like), for example.

Alternatively, the combiner 30 may be configured so as to receive the output signal and the noise signal directly from the main driver 22 and the noise driver 24, without the output resistances 26 and the signal lines 28. In this case, the output resistances 26 and the signal lines 28, which are connected to each other in series, are provided between the output end of the combiner 30 and the output terminal 12 of the output device 10.

The controller 32 controls the timing at which the logic value of the control signal supplied to the noise driver 24 varies (varying timing) and the timing at which the enable signal is applied/stopped (switching timing), in accordance with the timing at which the logic value of the input signal supplied to the main driver 22 varies. The controller 32 thus controls the noise driver 24 to output the noise signal containing the noise waveform.

For example, the controller 32 causes the noise driver 24 to output a noise signal containing a noise waveform that corresponds to the noise that may occur when the output signal output from the main driver 22 travels through a transmission line of the actual usage environment of the device under test. For example, the controller 32 controls the varying timing for the control signal and the switching timing for the enable signal in such a manner that the noise driver 24 generates a noise waveform corresponding to the above-described noise that is obtained through measurement or simulation.

Figure 2:
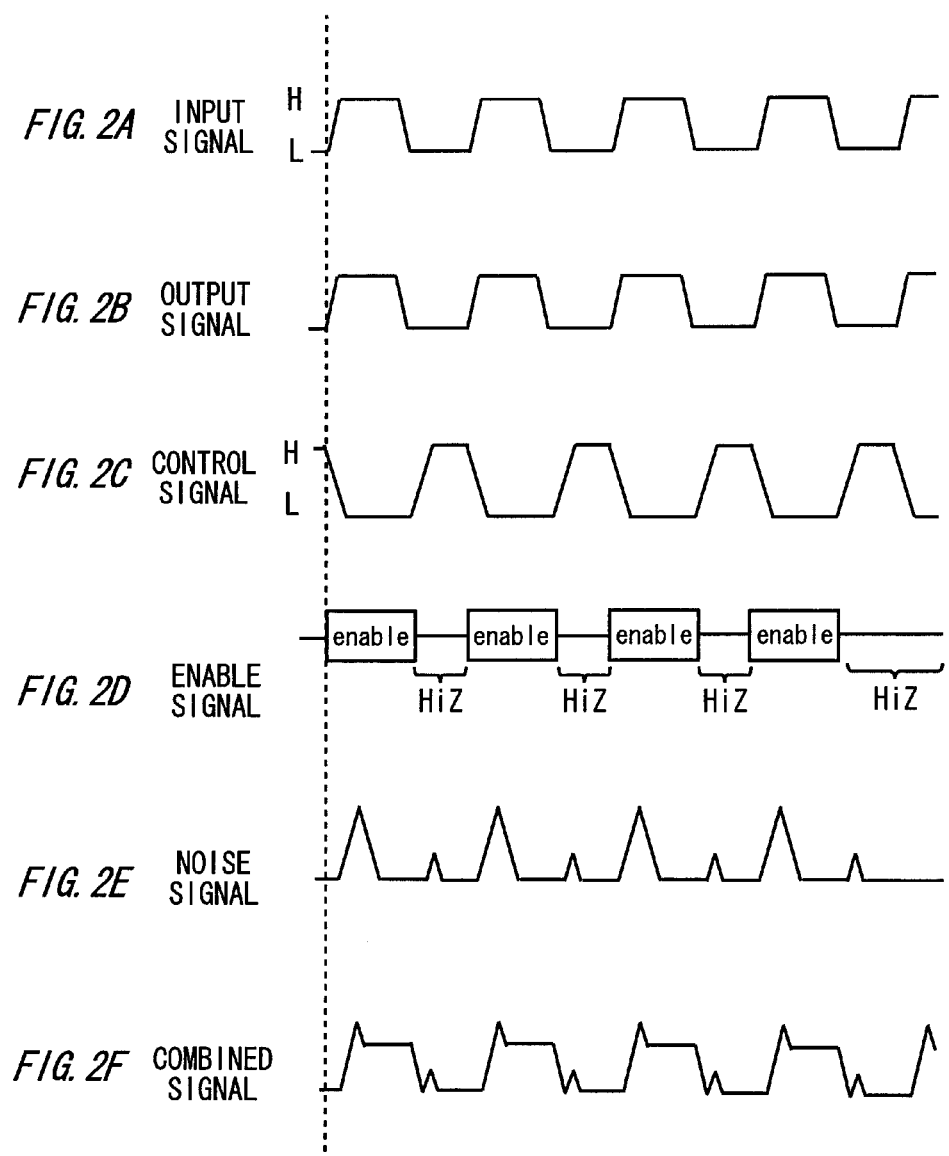
FIGS. 2A to 2F illustrate exemplary signals generated by the output device 10 relating to the present embodiment.

FIGS. 2A to 2F illustrate exemplary signals generated by the output device 10 relating to the present embodiment. The main driver 22 receives an input signal whose logic value varies at a designated timing as shown in FIG. 2A.

The main driver 22 varies the voltage level of the output signal from the voltage level corresponding to the L logic to the voltage level corresponding to the H logic as shown in FIG. 2B, when the waveform of the input signal varies from the L logic to the H logic. On the other hand, the main driver 22 varies the voltage level of the output signal from the voltage level corresponding to the H logic to the voltage level corresponding to the L logic as shown in FIG. 2B, when the waveform of the input signal varies from the H logic to the L logic.

The controller 32 varies the logic value of the control signal in a predetermined direction at the timing that is delayed or advanced by a predetermined amount from the varying timing of the input signal, for example, as shown in FIG. 2C. The controller 32 switches the state of the enable signal to a predetermined state at the timing that is delayed or advanced by a predetermined amount from the varying timing of the input signal, for example, as shown in FIG. 2D.

The noise driver 24 outputs a noise signal containing a noise waveform that is shaped in accordance with the timing at which and the direction in which the control signal varies and the timing at which and the direction in which the enable signal is switched, for example, as shown in FIG. 2E. For example, the noise driver 24 generates a triangular noise waveform, whose peak level varies in accordance with the timing at which and the direction in which the control signal varies and the timing at which and the direction in which the enable signal is switched.

The combiner 30 outputs a combined signal obtained by adding together the output signal shown in FIG. 2B and the noise signal shown in FIG. 2E, as shown in FIG. 2F. Note that the vertical variation range (the variation in level) for the noise signal is enlarged in FIG. 2E.

Figure 3:
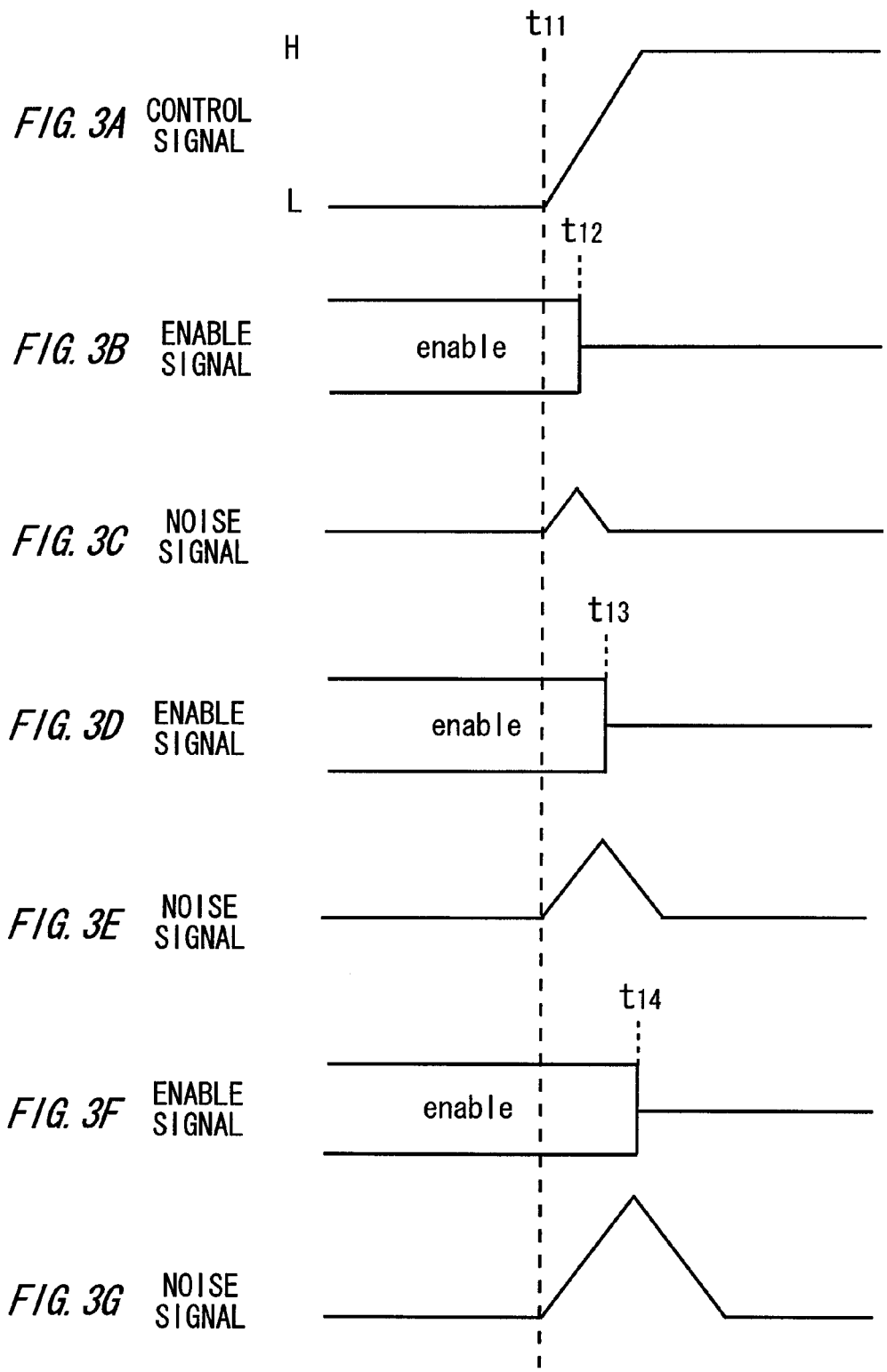
FIGS. 3A to 3G illustrate exemplary noise waveforms in association with the respective temporal differences between the varying timing for a control signal and the switching timing for an enable signal, when the control signal supplied to a noise driver 24 varies from the L logic to the H logic and the enable signal is switched from the supplied state to the non-supplied state in the present embodiment.

FIGS. 3A to 3G illustrates exemplary noise waveforms in association with the respective temporal differences between the varying timing for the control signal and the switching timing for the enable signal, when the control signal supplied to the noise driver 24 varies from the L logic to the H logic and the enable signal is switched from the supplied state (enabled state) to the non-supplied state (high-impedance state). For example, the control signal supplied from the controller 32 to the noise driver 24 varies from the L logic to the H logic as shown in FIG. 3A.

In a certain case, the controller 32 switches the enable signal from the supplied state to the non-supplied state, at a timing t12 that is a short period of time after a timing t11 at which the control signal starts varying (the timing t12 is at least before the control signal reaches the H logic level) as shown in FIG. 3B. In this manner, the noise driver 24 can output a noise signal including a triangular noise waveform whose level increases from the timing t11 to the timing t12 and decreases from the timing t12 until reaching the L logic level, as shown in FIG. 3C.

In a different case, the controller 32 switches the enable signal from the supplied state to the non-supplied state at a timing t13 that is a certain period of time after the timing t11 at which the control signal starts varying and comes after the timing t12 (the timing t13 is at least before the control signal reaches the H logic level), as shown in FIG. 3D. In this manner, the noise driver 24 can output a noise signal including a triangular noise waveform whose level increases from the timing t11 to the timing t13 and decreases from the timing t13 until reaching the L logic level, as shown in FIG. 3E. In this case, the noise driver 24 generates a triangular wave with a higher peak level than that of the triangular wave shown in FIG. 3C.

In a further different case, the controller 32 switches the enable signal from the supplied state to the non-supplied state at a timing t14 at which the control signal reaches the H logic level, as shown in FIG. 3F. In this manner, the noise driver 24 can output a noise signal including a triangular noise waveform whose level increases from the timing t11 to the timing t14 and decreases from the timing t14 until reaching the L logic level, as shown in FIG. 3G.

Figure 4:
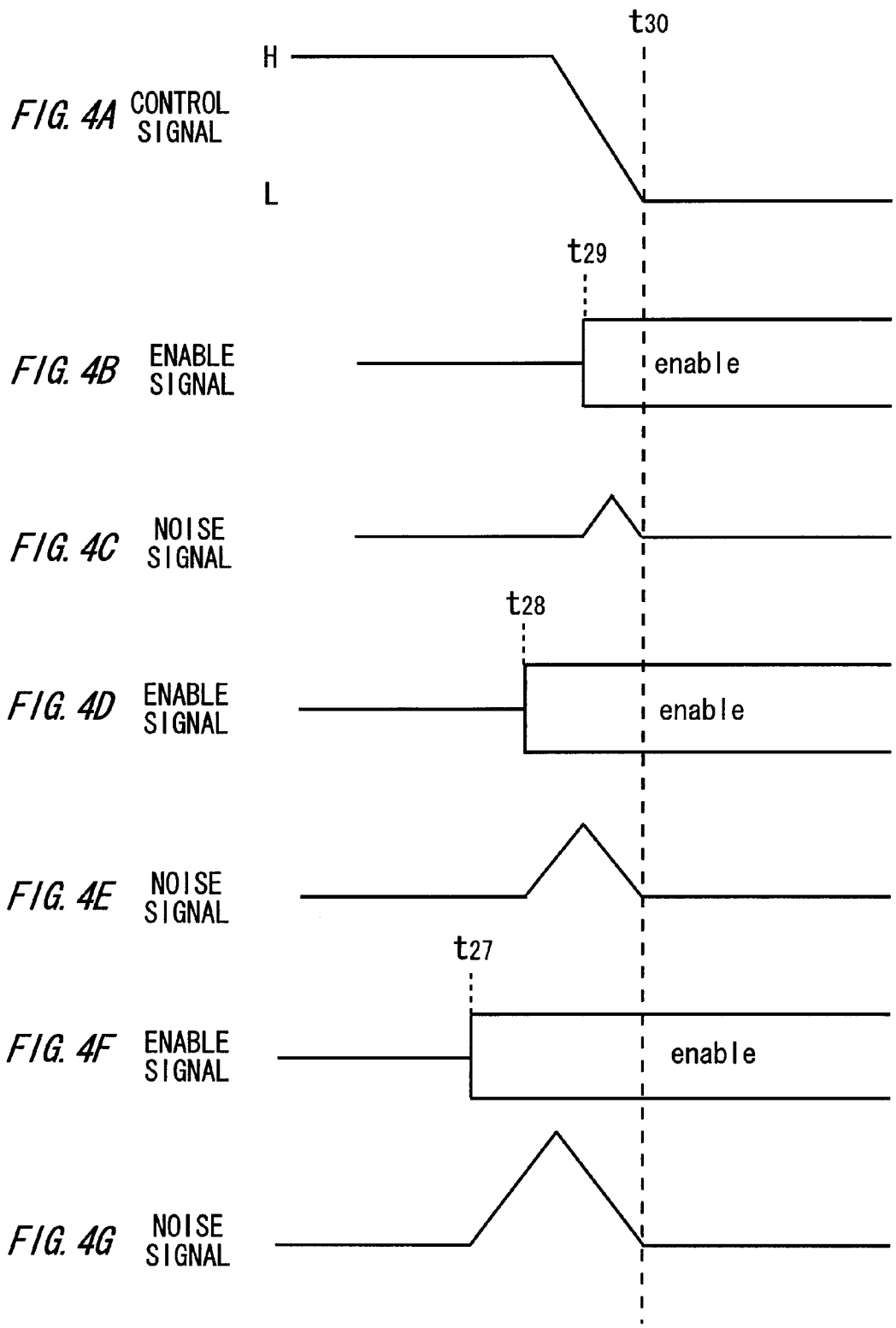
FIGS. 4A to 4G illustrate exemplary noise waveforms in association with the respective temporal differences between the varying timing for the control signal and the switching timing for the enable signal, when the control signal supplied to the noise driver 24 varies from the H logic to the L logic and the enable signal is switched from the non-supplied state to the supplied state in the present embodiment.

FIGS. 4A to 4G illustrate exemplary noise waveforms in association with the respective temporal differences between the varying timing for the control signal and the switching timing for the enable signal, when the control signal supplied to the noise driver 24 varies from the H logic to the L logic and the enable signal is switched from the non-supplied state (high-impedance state) to the supplied state (enabled state). For example, the control signal supplied from the controller 32 to the noise driver 24 varies from the H logic to the L logic as shown in FIG. 4A.

In a certain case, the controller 32 switches the enable signal from the non-supplied state to the supplied state, at a timing t29 that is a short period of time before a timing t30 at which the control signal finishes varying as shown in FIG. 4B. In this manner, the noise driver 24 can output a noise signal including a triangular noise waveform whose level increases from the timing t29 to an intermediate timing between the timing t29 and the timing t30 and decreases from the intermediate timing until reaching the L logic level, as shown in FIG. 4C.

In a different case, the controller 32 switches the enable signal from the non-supplied state to the supplied state at a timing t28 that is a certain period of time before the timing t30 at which the control signal finishes varying and comes before the timing t29, as shown in FIG. 4D. In this manner, the noise driver 24 can output a noise signal including a triangular noise waveform whose level increases from the timing t28 to an intermediate timing between the timing t28 and the timing t30 and decreases from the intermediate timing until reaching the L logic level, as shown in FIG. 4E. In this case, the noise driver 24 can generate a triangular wave with a higher peak level than that of the triangular wave shown in FIG. 4C.

In a further different case, the controller 32 switches the enable signal from the non-supplied state to the supplied state at a timing t27 that is before the timing t30 at which the control signal finishes varying by a period of time twice as long as the period of time necessary for the control signal completes varying from the H logic level to the L logic level (the timing t27 is at least before the timing t28), as shown in FIG. 4F. In this manner, the noise driver 24 can output a noise signal including a triangular noise waveform whose level increases from the timing t27 until reaching the H logic level and decreases from the H logic level to the L logic level, as shown in FIG. 4G.

As described above, the controller 32 can control the noise waveform generated by the noise driver 24, by controlling the timing at which and the direction in which the control signal varies and the timing at which and the direction in which the enable signal is switched. For example, the controller 32 can control the peak level of the triangular noise waveform by controlling the timing at which and the direction in which the control signal varies and the timing at which and the direction in which the enable signal is switched.

Figure 5:
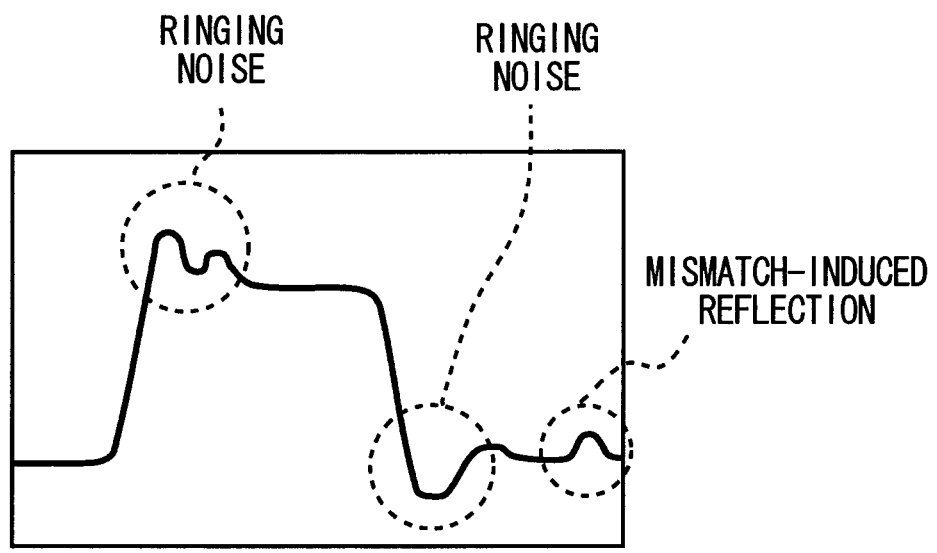
FIG. 5 illustrates, as an example, an output signal with a rectangular waveform, observed after the output signal has traveled through a transmission line of an actual usage environment of a device under test.
Figure 6:
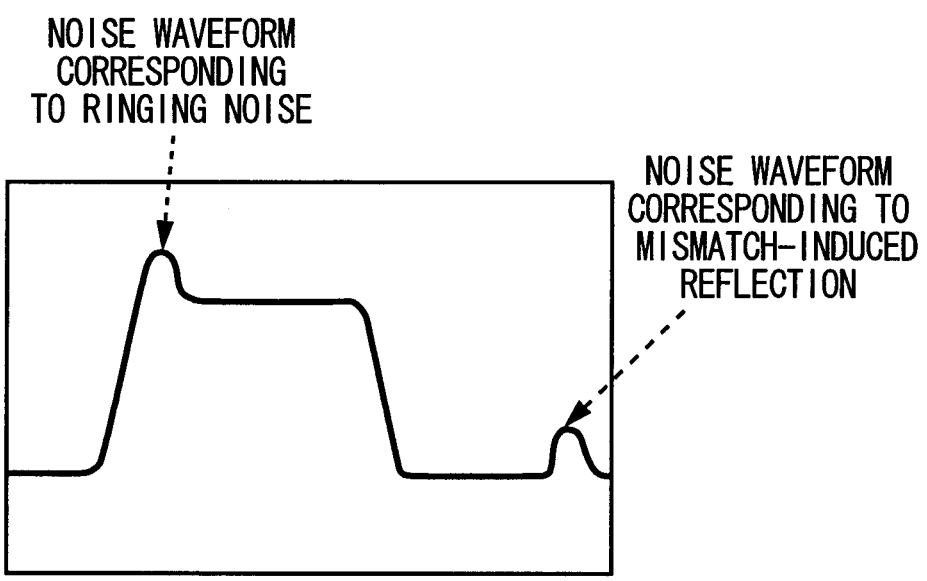
FIG. 6 illustrates an exemplary combined signal obtained by combining together an output signal and a noise signal that contains a noise waveform corresponding to ringing noise and a noise waveform corresponding to mismatch-induced reflection.

FIG. 5 illustrates, as an example, an output signal with a rectangular waveform, observed after the output signal has traveled through the transmission line of the actual usage environment of the device under test. FIG. 6 illustrates an exemplary combined signal obtained by combining together an output signal and a noise signal that contains a noise waveform corresponding to ringing noise and a noise waveform corresponding to mismatch-induced reflection.

As shown in FIG. 5, the noise that occurs in the signal while the signal travels through the transmission line includes, for example, ringing noise. The ringing noise is generated by the L and C components of the transmission line. For example, the controller 32 controls the noise driver 24 to output a noise signal including a noise waveform corresponding to the ringing noise that may occur when the output signal output from the main driver 22 travels through a predetermined transmission line.

For example, the controller 32 controls the noise driver 24 to generate a triangular noise waveform having a predetermined peak level, at a timing that is delayed by a predetermined period of time from the timing at which the input signal varies. In this manner, the controller 32 can add to the output signal the noise waveform corresponding to the ringing noise. For example, the controller 32 may determine the peak level of the noise and the timing at which the noise is generated relative to the timing at which the input signal varies, based on the measured or simulated ringing noise that may occur when the output signal output from the main driver 22 travels through the transmission line of the actual usage environment.

As shown in FIG. 5, the noise that occurs in the signal while the signal travels through the transmission line includes, for example, mismatch-induced reflection. The mismatch-induced reflection occurs when the signal travels through a connector or the like within the transmission line. For example, the controller 32 may control the noise driver 24 to output a noise signal containing a noise waveform corresponding to the mismatch-induced reflection that may occur when the output signal travels through a predetermined transmission line.

For example, the controller 32 controls the noise driver 24 to generate a triangular noise waveform with a predetermined peak level, at a timing that is delayed by a predetermined period of time from the timing at which the pulse of the input signal is generated. In this manner, the controller 32 can add to the output signal the noise waveform corresponding to the mismatch-induced reflection. For example, the controller 32 may determine the peak level of the noise and the timing at which the noise is generated relative to the timing at which the pulse of the input signal is generated, based on the measured or simulated mismatch-induced reflection that may occur when the output signal output from the main driver 22 travels through the transmission line of the actual usage environment.

The noise that occurs in the signal while the signal travels through the transmission line includes, for example, crosstalk. The crosstalk results from leakage of a signal from an adjacent transmission line. The controller 32 may control the noise driver 24 to output a noise signal containing a noise waveform corresponding to the crosstalk that may occur when the output signal travels through a predetermined transmission line, for example.

For example, the controller 32 controls the noise driver 24 to generate a triangular wave with a predetermined peak level at a timing that is delayed by a predetermined period of time from the timing at which the pulse of the input signal to be transmitted through the adjacent transmission line is generated. In this way, the controller 32 can add to the output signal the noise waveform corresponding to the crosstalk.

As described above, the output device 10 relating to the present embodiment can add a noise waveform to the output signal generated in accordance with the input signal. Furthermore, the output device 10 relating to the present embodiment can generate a designated noise waveform by controlling the noise driver 24 with the use of the enable signal, thereby generating a noise waveform having a shorter duration than the minimum duration that can be achieved by the logic pattern of the input signal supplied to the main driver 22.

Figure 7:
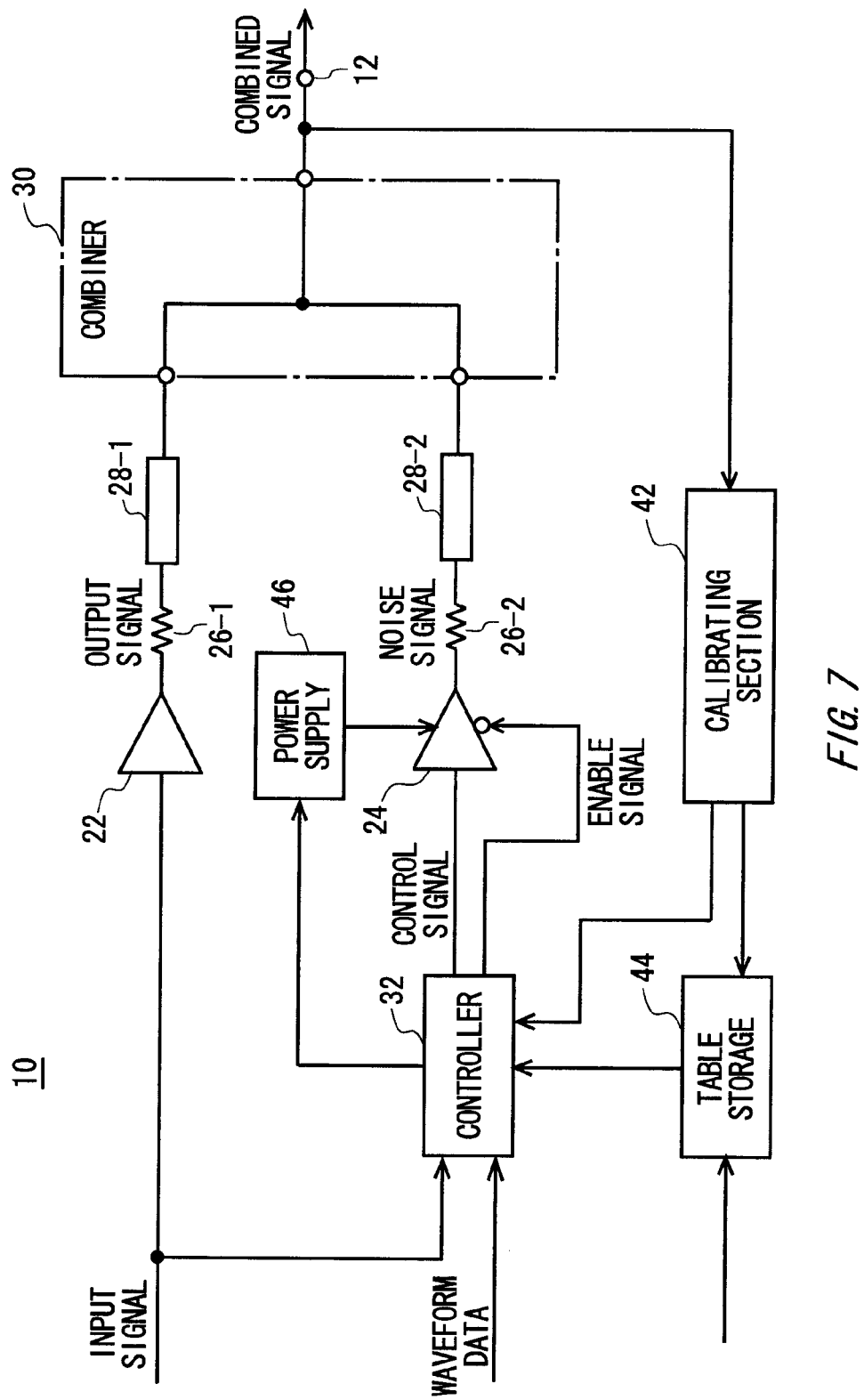
FIG. 7 illustrates the configuration of an output device 10 relating to a modification example of the embodiment.
Figure 8:
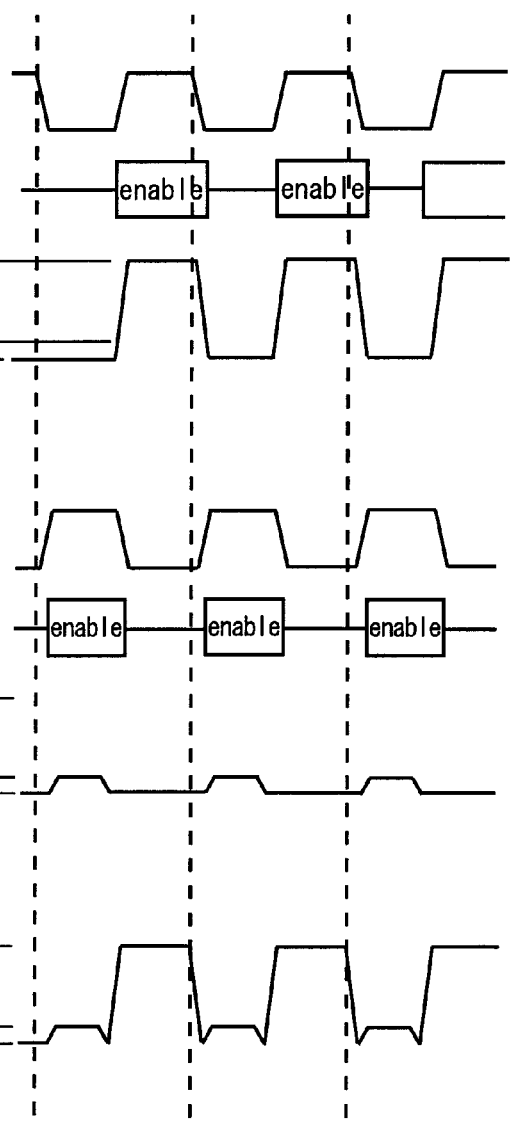
FIGS. 8A to 8G illustrate exemplary signals generated by the output device 10 relating to the modification example.

FIG. 7 illustrates the configuration of an output device 10 relating to a modification example of the embodiment. The output device 10 relating to the modification example has substantially the same configuration and functionality as the output device 10 relating to the embodiment described with reference to FIGS. 1 to 6. Therefore, the constituents having substantially the same configuration and functionality as the corresponding constituents of the output device 10 relating to the embodiment are assigned with the same reference numerals as in the embodiment. The following description of the modification example is made with focus on the differences from the embodiment.

The output device 10 relating to the modification example additionally includes a calibrating section 42, a table storage 44, and a power supply 46. The calibrating section 42 measures a noise waveform (for example, measures a peak level and a delay time in the case of a triangular noise waveform) generated by the noise driver 24, in association with each combination of the varying timing for the control signal and the switching timing for the enable signal.

The table storage 44 stores, in association with each noise waveform (for example, each set of a peak level and a delay time in the case of a triangular waveform), a timing at which the control signal varies and a timing at which the enable signal is switched to generate the noise waveform. For example, the table storage 44 may store the result of the measurement done by the calibrating section 42.

The power supply 46 supplies a power supply voltage to the noise driver 24. The controller 32 controls the power supply voltage generated by the power supply 46 to control the voltage level of the noise signal output from the noise driver 24.

The controller 32 receives waveform data representing the noise waveform that may occur when the output signal travels through a predetermined transmission line (for example, the transmission line of the actual usage environment of the device under test). For example, the controller 32 receives waveform data representing measured or simulated noise waveform that may occur in the predetermined transmission line.

The controller 32 determines the noise waveform in accordance with the waveform data received from outside. For example, the controller 32 determines the peak level of a triangular noise waveform and the delay time representing the time interval from the timing at which the output signal varies to the peak of the triangular noise waveform, in accordance with the waveform data received from outside.

The controller 32 selects, from the table storage 44, the timing at which the control signal should vary and the timing at which the enable signal should be switched to generate the determined noise waveform. The controller 32 then adjusts the control signal and the enable signal, based on the timing at which and the direction in which the logic value of the input signal supplied to the main driver 22 varies and the selected timings. In this manner, the controller 32 can control the noise driver 24 to output the noise waveform that may occur in the signal while the signal travels through the predetermined transmission line.

The controller 32 may control the voltage level of the noise signal output from the noise driver 24, in accordance with the level of the noise waveform that may occur when the output signal output from the main driver 22 travels through the predetermined transmission line. In this manner, the controller 32 can also control the noise driver 24 to output the noise waveform that may occur in the signal while the signal the predetermined transmission line.

Alternatively, the output device 10 may include a plurality of noise drivers 24. In this case, the output device 10 can combine together the noise waveforms generated by the noise drivers 24, thereby creating a more complex noise waveform.

The output device 10 may include a plurality of noise drivers 24 that respectively generate different noise waveforms. For example, the controller 32 may include a noise driver 24 that generates a triangular wave whose peaks are positioned on the positive side and another noise driver 24 that generates a triangular wave whose peaks are positioned on the negative side. In this manner, the output device 10 can add to the output signal a noise waveform whose polarity varies depending on the direction in which the input signal varies, for example.

The output end of the controller 32 may be connected to a capacitor or the like. In this way, the controller 32 can cause the noise driver 24 to generate a differentiated or integrated noise waveform.

FIGS. 8A to 8G illustrate exemplary signals generated by the output device 10 relating to the modification example. For example, the output device 10 may include a first noise driver 24 and a second noise driver 24.

The noise signal output from the first noise driver 24 has a negative voltage (for example, −0.5 V) when the enable signal is not applied and the control signal has the L logic, as shown in FIGS. 8A to 8C. The noise signal output from the first noise driver 24 has a voltage equal to or higher than 0 V (for example, 2 V) when the control signal has the H logic.

The controller 32 switches the enable signal for the first noise driver 24 to the supplied state while the control signal has the H logic. In this way, the first noise driver 24 can output a noise signal having a rectangular wave in which the voltage is alternately switched between the negative voltage (for example, −0.5 V) and the voltage equal to or higher than 0 V (for example, 2 V).

The noise signal output from the second noise driver 24 has a negative voltage (for example, −0.5 V) when the enable signal is not applied and the control signal has the L logic, as shown in FIGS. 8D to 8F. The noise signal output from the second noise driver 24 has a voltage equal to or higher than 0 V (for example, 0 V) when the control signal has the H logic.

The controller 32 switches the enable signal for the second noise driver 24 to the supplied state while the control signal has the H logic. In this way, the second noise driver 24 can output a noise signal having a rectangular wave in which the voltage is alternately switched between the negative voltage (for example, −0.5 V) and the positive voltage (for example, 0 V).

Here, the controller 32 supplies to the first and second noise drivers 24, control signals whose phases are shifted by 180 degrees (or which are inverted) with respect to each other. Thus, the output device 10 relating to the modification example can generate a combined noise signal including a noise waveform having a peak on the negative side at the timing at which the control signals are switched, as shown in FIG. 8G.

Figure 9:
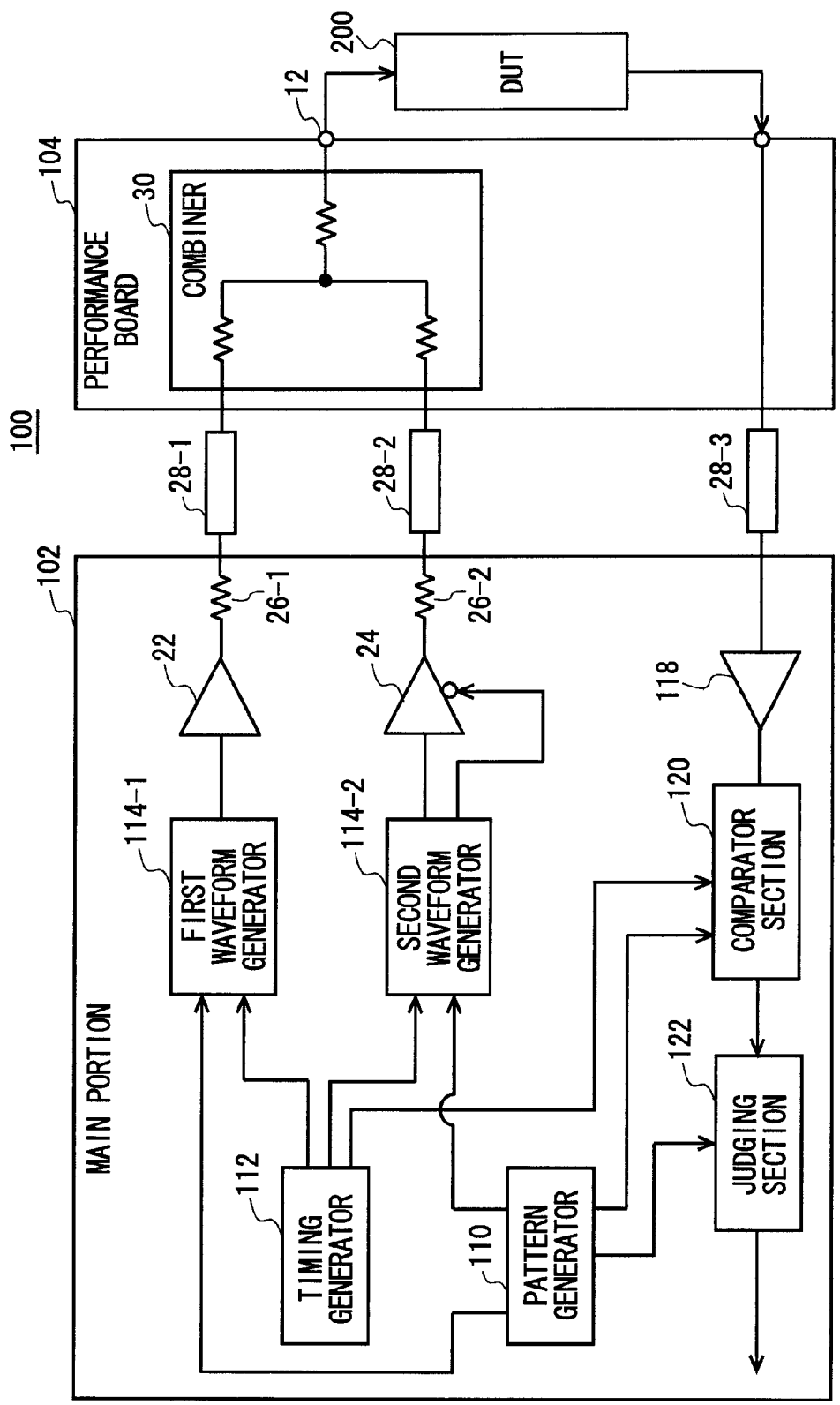
FIG. 9 illustrates the configuration of a test apparatus 100 relating to an embodiment of the present invention, together with a device under test (DUT) 200.

FIG. 9 illustrates the configuration of a test apparatus 100 relating to an embodiment of the present invention, together with a device under test (DUT) 200. The test apparatus 100 has the constituents of the output device 10 described with reference to FIGS. 1 to 8. The constituents of the test apparatus 100 that have substantially the same configuration and functionality as the corresponding constituents of the output device 10 are assigned with the same reference numerals as in FIGS. 1 to 8. The following description of the test apparatus 100 is made with a focus on the differences from the output device 10 shown in FIGS. 1 to 8.

The test apparatus 100 tests the DUT 200. The test apparatus 100 includes a main portion 102 and a performance board 104. The main portion 102 supplies a signal to the DUT 200 and acquires a signal from the DUT 200.

The performance board 104 has the DUT 200 mounted thereon. The performance board 104 is connected to the main portion 102 via a signal line 28.

The main portion 102 includes a pattern generator 110, a timing generator 112, a first waveform generator 114-1, a second waveform generator 114-2, a main driver 22, a noise driver 24, a first output resistance 26-1, a second output resistance 26-2, a level comparator 118, a comparator section 120, and a judging section 122.

The pattern generator 110 generates a logic pattern representing the waveform of the signal to be generated by the main portion 102 and the generation timing at which the signal is to be generated. The pattern generator 110 also generates an expected pattern representing the expected value of a signal to be received at the main portion 102 from the DUT 200 and the acquisition timing at which the signal from the DUT 200 is to be acquired. The pattern generator 110 supplies the logic pattern to the first and second waveform generators 114-1 and 114-2. The pattern generator 110 also supplies the expected value to the judging section 122 and supplies the acquisition timing to the comparator section 120.

The timing generator 112 generates a timing signal representing the timing at which the main portion 102 outputs a signal. The timing generator 112 also generates a strobe signal representing the timing at which the main portion 102 acquires the value of a signal. The timing generator 112 supplies the timing signal to the first and second waveform generators 114-1 and 114-2 and supplies the strobe signal to the comparator section 120.

The first and second waveform generators 114-1 and 114-2 delay the supplied timing signal by a delay amount determined according to the generation timing designated by the pattern generator 110. The first waveform generator 114-1 generates an input signal having a waveform designated by the pattern generator 110 at the timing indicated by the delayed timing signal. The first waveform generator 114-1 supplies the generated input signal to the main driver 22.

The second waveform generator 114-2 generates an enable signal and a control signal having a waveform designated by the pattern generator 110 at the timing indicated by the delayed timing signal. The second waveform generator 114-2 supplies the generated control signal and enable signal to the noise driver 24.

The main driver 22 supplies an output signal having a voltage level determined according to the input signal supplied thereto from the first waveform generator 114-1, to the performance board 104 via the first output resistance 26-1 and a first signal line 28-1. The noise driver 24 supplies a noise signal having a noise waveform shaped in accordance with the enable signal and the control signal supplied thereto from the second waveform generator 114-2, to the performance board 104 via the second output resistance 26-2 and a second signal line 28-2.

The level comparator 118 receives a signal from a corresponding terminal of the DUT 200 via a third signal line 28-3 and generates a logic signal whose logic value varies according to the voltage level of the received signal. The level comparator 118 supplies the generated logic signal to the comparator section 120.

The comparator section 120 delays the strobe signal supplied thereto from the timing generator 112 by a delay time determined according to the acquisition timing designated by the pattern generator 110. The comparator section 120 acquires the logic value of the logic signal output from the level comparator 118 at the timing indicated by the delayed strobe signal. The comparator section 120 supplies the acquired logic value to the judging section 122.

The judging section 122 compares the logic value acquired by the comparator section 120 against the expected value designated by the pattern generator 110 and examines whether they match. The comparator section 120 supplies the result of the comparison to an external controller. The judging section 122 may write the result of the comparison into a memory or the like.

In the present embodiment, the performance board 104 includes a combiner 30. The combiner 30 adds together the output signal output from the main driver 22 and the noise signal output from the noise driver 24, to generate a combined signal. The combiner 30 then supplies the combined signal, as a test signal, to a predetermined terminal of the DUT 200.

The main driver 22, the noise driver 24, the first output resistance 26-1, the second output resistance 26-2, the first signal line 28-1, the second signal line 28-2, and the combiner 30 of the test apparatus 100 have the same functions as the corresponding constituents of the output device 10. The second waveform generator 114-2 of the test apparatus 100 has the same function as the controller 32 of the output device 10. The above-described test apparatus 100 can supply to the DUT 200 a test signal having a designated noise waveform added thereto.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. An output device comprising:
   a main driver operable to output an output signal in accordance with an input signal input thereto;
   a controller operable to receive waveform data representing a waveform that would occur if the output signal were to travel through a predetermined transmission line and to determine a noise waveform in accordance with the received waveform data;
   a noise driver operable to output a noise signal containing the noise waveform; and
   a combiner operable to output a combined signal obtained by combining together the output signal and the noise signal.

2. The output device as set forth in claim 1, wherein
   the noise driver is operable to (i) set an output end thereof at high impedance when not supplied with an enable signal, and (ii) vary a voltage level of the noise signal to be output therefrom in accordance with how a control signal supplied thereto varies when supplied with the enable signal, and
   the controller is operable to control the noise driver to output the noise signal containing the noise waveform by controlling a timing at which the control signal varies and a timing at which the enable signal is switched.

3. The output device as set forth in claim 2, wherein
   the noise waveform corresponds to ringing noise that would occur if the output signal were to travel through the predetermined transmission line.

4. The output device as set forth in claim 2, wherein
   the noise waveform corresponds to mismatch-induced reflection that would occur if the output signal were to travel through the predetermined transmission line.

5. The output device as set forth in claim 2, wherein
   the controller is operable to control the noise driver to vary the voltage level of the noise signal to be output therefrom, in accordance with a level of noise that would occur in the output signal if the output signal were to travel through the predetermined transmission line.

6. A test apparatus for testing a device under test, the test apparatus comprising;
   the output device as set forth in claim 1, the output device operable to supply the combined signal to the device under test as a test signal; and
   a judging section operable to examine whether a logic value acquired based on a signal output from the device under test matches an expected value.

7. The test apparatus as set forth in claim 6, further comprising:
   a main portion including the main driver, the controller, and the noise driver of the output device; and
   a performance board including the combiner of the output device, wherein
   the device under test is mounted on the performance board, and
   the performance board is connected to the main portion via a signal line.

8. An output device comprising:
   a main driver to output an output signal in accordance with an input signal input thereto;
   a controller operable to determine a noise waveform that would occur if the output signal were to travel through a predetermined transmission line;
   a noise driver operable to output a noise signal containing the noise waveform; and
   a combiner operable to output a combined signal obtained by combining together the output signal and the noise signal wherein
   the noise driver is operable to (i) set an output end thereof at high impedance when not supplied with an enable signal, and (ii) vary a voltage level of the noise signal to be output therefrom in accordance with how a control signal supplied thereto varies when supplied with the enable signal,
   the controller is operable to control the noise driver to output the noise signal containing the noise waveform by controlling a timing at which the control signal varies and a timing at which the enable signal is switched,
   the output device further comprises a table storage that stores, in association with each noise waveform, a timing at which the control signal varies and a timing at which the enable signal is switched in order to generate the noise waveform, and
   the controller is operable to refer to a noise waveform designated by an external device to select from the table storage a timing at which the control signal varies and a timing at which the enable signal is switched, and to control the control signal and the enable signal in accordance with the selected timings.

9. The output device as set forth in claim 2, further comprising:
   a power supply operable to supply a power supply voltage to the noise driver, wherein
   the controller is operable to control the power supply voltage generated by the power supply to control the voltage level of the noise signal output from the noise driver.

10. The output device as set forth in claim 2, wherein
    the noise waveform corresponds to crosstalk that would occur if the output signal were to travel through the predetermined transmission line.

11. The output device as set forth in claim 1, wherein
    the noise driver is one of a plurality of noise drivers operable to output different noise waveforms,
    the output device comprises the plurality of noise drivers, and
    the output device is operable to combine together the noise waveforms generated by the plurality of noise drivers to create a combined noise waveform.

12. The output device as set forth in claim 11, wherein
    a first noise driver from among the plurality of noise drivers is operable to generate a waveform whose peak is positioned on a positive side of a timing at which the control signal is switched, and
    a second noise driver from among the plurality of noise drivers is operable to generate a waveform whose peak is positioned on a negative side of a timing at which the control signal is switched.

13. The output device as set forth in claim 12, wherein the controller is operable to supply to the first noise driver and the second noise driver control signals whose phases are shifted by 180 degrees with respect to each other.

14. The output device as set forth in claim 8, further comprising:
a calibrating section operable to measure the noise waveform of the noise signal output by the noise driver, wherein
the table storage stores the timing at which the control signal varies and the timing at which the enable signal is switched in association with the noise waveform measured by the calibrating section.

15. A method comprising:
generating an output signal in accordance with an input signal;
receiving waveform data representing a waveform that would occur if the output signal were to travel through a predetermined transmission line;
determining a noise waveform in accordance with the received waveform data
generating a noise signal containing the noise waveform; and
combining together the output signal and the noise signal.

16. The method as set forth in claim 15, further comprising:
setting an output end of a noise driver that outputs the noise signal at high impedance when the noise driver is not supplied with an enable signal;
varying a voltage level of the noise signal in accordance with how a control signal supplied to the noise driver varies when the noise driver is supplied with the enable signal; and
controlling a timing at which the control signal varies and a timing at which the enable signal is switched.

17. The method as set forth in claim 16, wherein
the noise waveform corresponds to ringing noise, mismatch-induced reflection, or crosstalk that would occur if the output signal were to travel through the predetermined transmission line.

18. The method as set forth in claim 16, further comprising:
storing, in association with each noise waveform, a timing in which the control signal varies and a timing at which the enable signal is switched in order to generate the noise waveform;
referring to an externally designated noise waveform to select from the table storage a timing at which the control signal varies and a timing at which the enable signal is switched; and
controlling the control signal and the enable signal in accordance with the selected timings.

19. The method as set forth in claim 16, further comprising:
controlling the noise driver to vary the voltage level of the noise signal to be output therefrom, in accordance with a level of noise that would occur in the output signal if the output signal were to travel through the predetermined transmission line.

20. A method of testing a device under test, comprising:
the method as set forth in claim 15;
supplying the combined output signal and noise signal to the device under test as a test signal; and
examining whether a logic value acquired based on a signal output from the device under test matches an expected value.

* * * * *